United States Patent [19]
Ho et al.

[11] Patent Number: 5,839,184
[45] Date of Patent: Nov. 24, 1998

[54] METHOD FOR CREATING ON-PACKAGE INDUCTORS FOR USE WITH INTEGRATED CIRCUITS

[75] Inventors: Peter Chi-Ming Ho, San Mateo; D. Douglas Baumann, San Jose; Sang S. Lee, Sunnyvale, all of Calif.

[73] Assignee: VLSI Technology, Inc., San Jose, Calif.

[21] Appl. No.: 890,855

[22] Filed: Jul. 10, 1997

[51] Int. Cl.⁶ ........................................................ H01F 7/06
[52] U.S. Cl. ............................................. 29/605; 336/221
[58] Field of Search ............................... 29/605, 606, 832, 29/837, 838; 336/20, 119, 120, 130, 133, 176, 221

[56] References Cited

U.S. PATENT DOCUMENTS 5,418,514  5/1995  Smith et al. ............................. 336/210

Primary Examiner—Timothy V. Eley
Assistant Examiner—Benjamin M. Halpern
Attorney, Agent, or Firm—Flehr Hohbach Test Albritton & Herbert LLP

[57] ABSTRACT

A method is described for creating an inductor in the package for an integrated circuit. The inductor is formed by utilizing one or more of the bond leads as the core of the inductor and by winding a series of coils about the core in connection either with the bond pads of the integrated circuit itself or to other bond leads for connection outside the integrated circuit chip.

6 Claims, 3 Drawing Sheets

METHOD FOR CREATING ON-PACKAGE INDUCTORS FOR USE WITH INTEGRATED CIRCUITS

FIELD OF THE INVENTION

This invention relates generally to the field of fabricating integrated circuits and more particularly to the manner of creating inductors on packaged integrated circuits in a convenient and space saving manner.

BACKGROUND OF THE INVENTION

In the preparation of integrated circuits it is frequently required that inductive components be employed and connected to the integrated circuit chip or an adjacent chip. Among the more problematic components needing to be included are inductors. Placing them on the printed circuit board would require a certain amount of area on the board itself. In order to save this board space, inductors can be fabricated on the integrated chip, usually in the form of a planar spiral; however, these types of inductors result in small inductances and poor Q factors.

SUMMARY OF THE INVENTION

Many integrated circuits are packaged in what is called PQFP (Plastic Quad Flat Package). PQFPs usually include a lead frame which is an array of bond leads arranged in a somewhat radial fashion and held in place at least temporarily by means of some form of an adhesive tape, usually a polyimide tape. The tape serves to hold the leads in position with respect to each other until such time as their ends are bonded to the individual bonding pads on the integrated circuit.

In accordance with the invention one or more of the bond leads can be employed as the core of an inductor. Generally an end of the lead is bent upwardly essentially perpendicular to the plane of the integrated circuit chip itself and a wire bonder is used to loop wire coils around it. Preferably the looped wire coils are noninsulated but rather a single electrical insulator is applied to the bond lead itself so that noninsulated wire can be used in the winding of the inductor.

BRIEF DESCRIPTION OF THE DRAWINGS

Additional objects and features of the invention will be more readily apparent from the following detailed description and the claims when taken in conjunction with the drawing in which:

DESCRIPTION OF THE PREFERRED EMBODIMENTS

Figure 1:
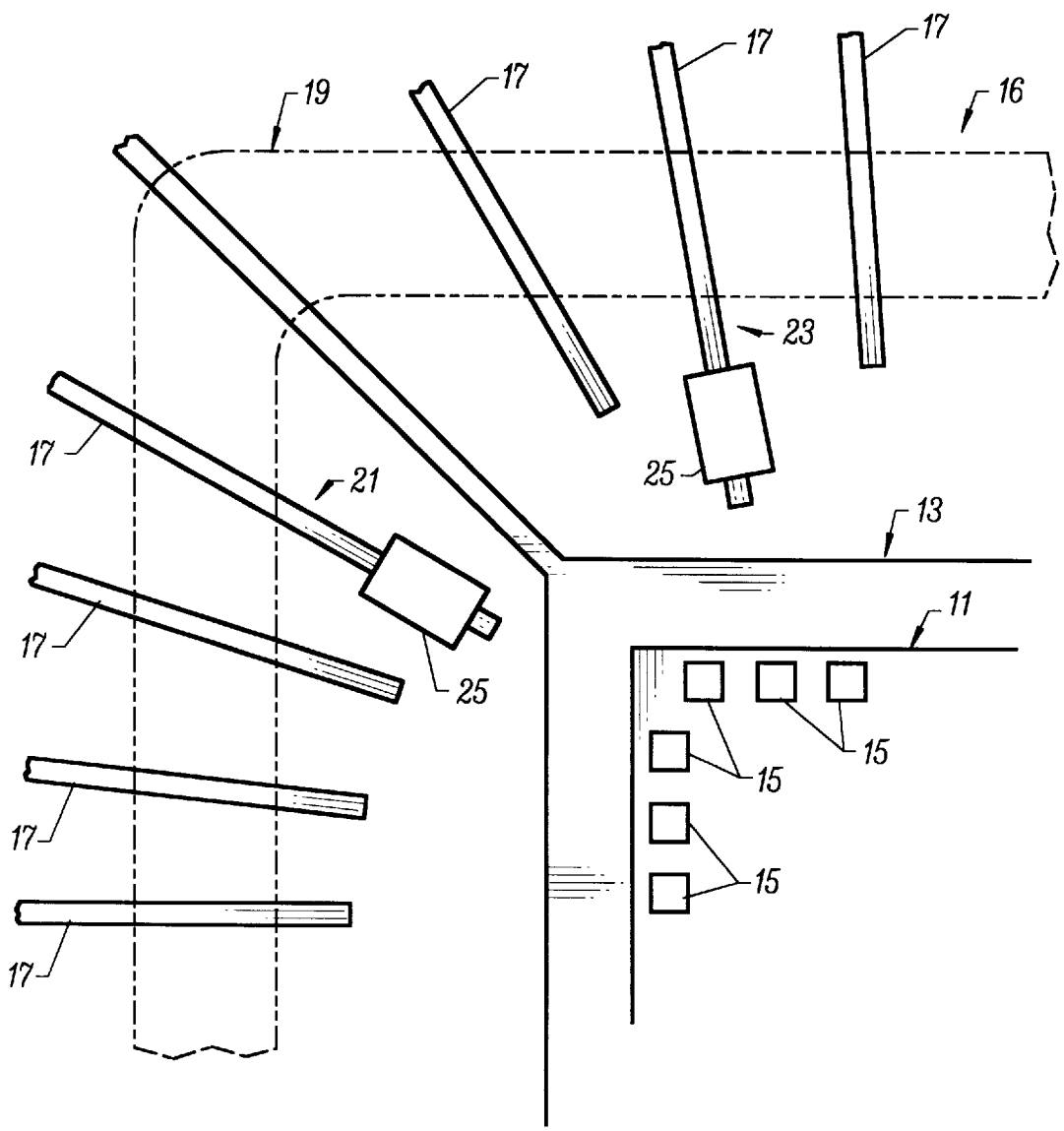
FIG. 1 is a schematic top plan view showing a portion of an internal package for an integrated circuit including a die paddle having an integrated circuit chip thereon with a number of bond pads together with a lead frame formed of a number of bond leads secured to a polyimide tape.

Referring to FIG. 1 there is partially shown an integrated circuit chip 11 disposed on a die paddle 13. The integrated chip includes a number of bond pads 15 disposed about the periphery of the chip.

A lead frame 16 is shown, including not only the paddle 13 upon which the integrated chip 11 rests but also a series of bond leads 17 which are retained in position by a polyimide tape 19 before the leads 17 themselves are actually connected to individual ones of the bond pads 15. In the usual course of fabricating the integrated circuit package the ends of specific bond leads 17 are secured to a specific bond pad 15 in order to interconnect the integrated circuit chip to other components.

Figure 2:
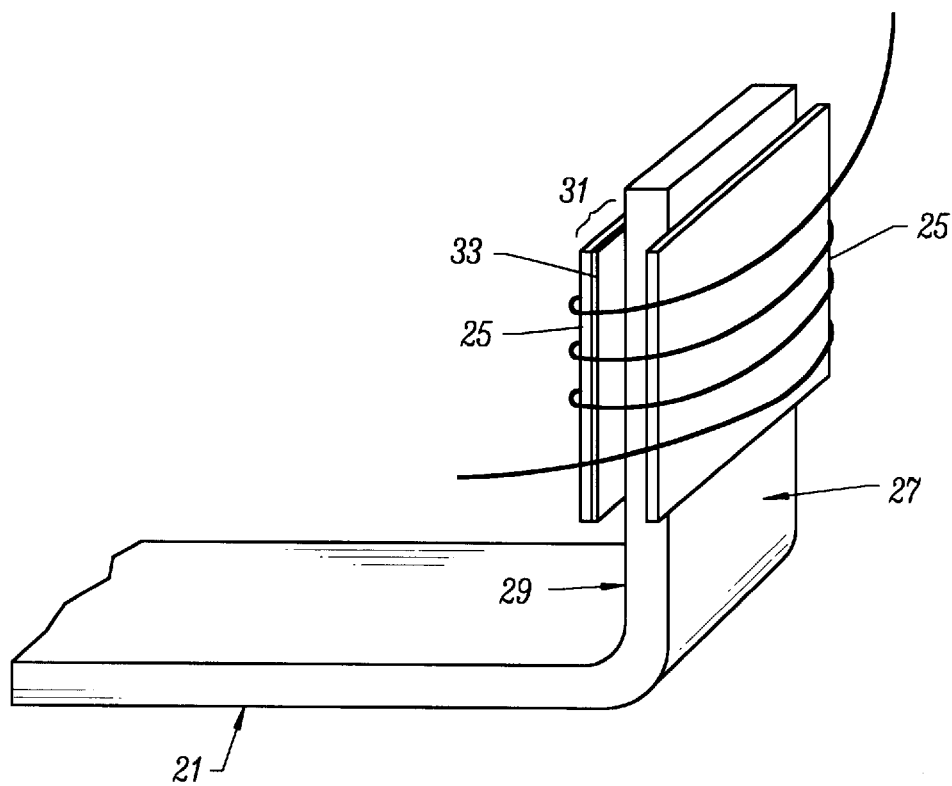
FIG. 2 is a detailed view of the end of a bond lead bent in preparation for winding a coil thereabout and including a magnetic material and a polyimide extending across two larger opposite surfaces to provide insulation and a better magnetic core.

In accordance with the invention one or more of the bond leads 17 such as the leads 21 and 23 as shown in FIG. 1 are selected to be turned into inductive elements rather than bond leads. This is accomplished in accordance with the invention by wrapping a series of wire coils about the bond lead 21 or 23 thereby using the bond lead material as a core for the inductor. Preferably this is accomplished by bending the individual bond lead 21 for instance as shown in FIG. 2 upwardly to be substantially perpendicular to the plane of the integrated circuit chip 11 and the paddle 13 and by applying insulating material such as a polyimide tape 25 to the opposing wide faces 27 and 29 of the lead 21. Thereafter a coil of suitable wire, such as gold, is wound about the insulating material to create noncontiguous coils in sufficient number to provide the desired inductance. The coils may be wrapped about the bond lead material using the usual wire bonder which is typically controllable in the x, y and z directions. The insulating material 25 overextends the width of the bond lead by margins 31 so as to provide insulation between the coil wire and the bond lead material itself even on the narrow edges of the lead.

Depending upon the inductance required a magnetic material mat also be applied to the bond lead 21 in the form of a sheet of magnetic material such as shown at 33. The magnetic material may be applied to either one or both sides of the lead material by sputtering or some other deposition method. The magnetic material may be not only a film sputtered onto the lead but could also be formed of a ferromagnetic material or a ceramic composite material.

Preferably the inductor is formed in the manner set forth above but alternatively it could be formed without the use of the insulating material 25 but rather with the use of insulated coil wire.

Figure 3:
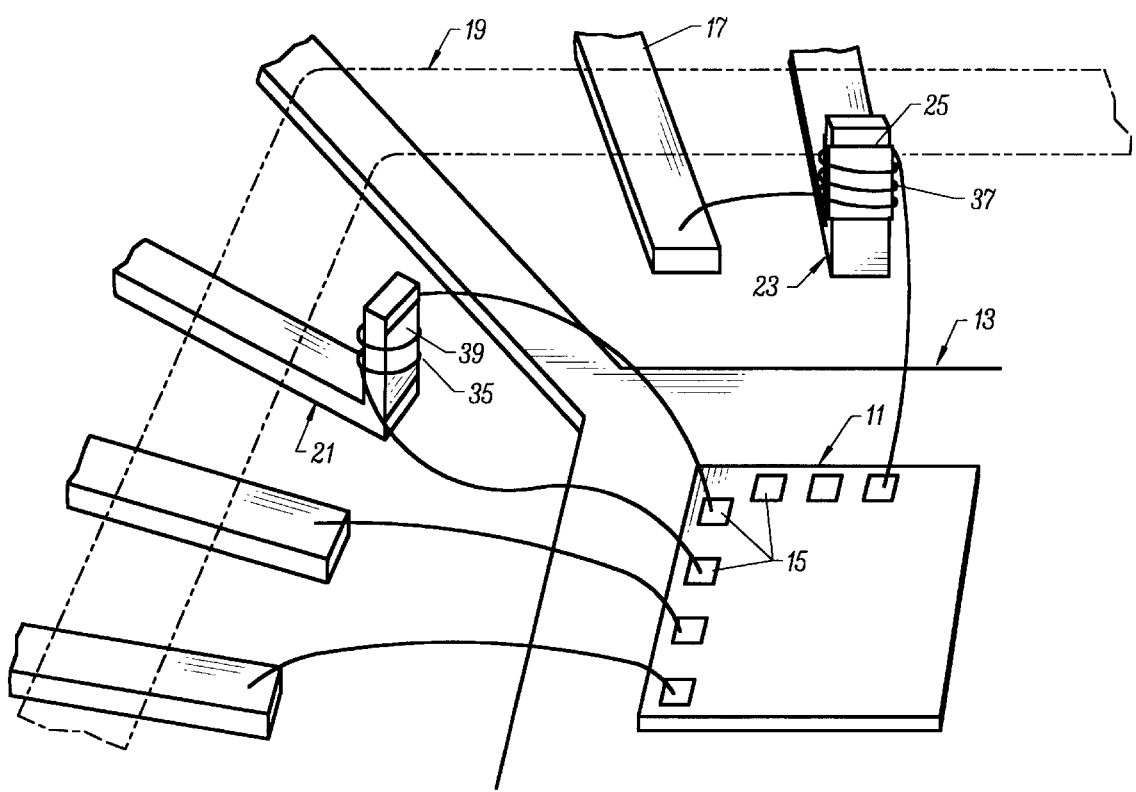
FIG. 3 is a schematic perspective view of the assembly shown in FIG. 1 showing the interconnection of the inductors formed in accordance with the invention to the integrated circuit chip and to other bond leads.

Referring now to FIG. 3 there is schematically shown an integrated circuit wherein the bond leads 21 and 23 have been converted to inductors with a number of coils 35 and 37 wound thereabout. The inductor 21 has its coils 35 connected at each end to the integrated circuit chip 11 whereas the inductor 23 has only one side connected to the chip and the other connected to another bond lead. Moreover there is no need for either of the coil ends to be connected to the chip itself but both could be directed to other bond leads. As shown in FIG. 3, the coil 35 is wound about the bond lead material with a magnetic material 39 having been sputtered onto the lead material.

Since there is no insulating material 25 on the lead material 21 the wire forming the coil 35 is insulated. On the other hand, as shown for the inductor formed on the lead material 23, insulating material 25 is applied and the wire forming the coil 37 is noninsulated. The two versions of the coiling shown in FIG. 3 are shown therein so as to view the versions themselves and it is not anticipated that both insulated and noninsulated wire would ordinarily be used in the same chip.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

We claim:

1. A method of forming an inductor on a bond lead of an integrated circuit device comprising the steps of:

bending a portion of said bond lead away from a surface of said integrated circuit device to form an inductor core;

applying an electrical insulator on said inductor core; and winding a wire around said inductor core and said electrical insulator to form a coil.

2. A method of forming an inductor on a bond lead of an integrated circuit device as defined in claim 1 wherein said portion of said bond lead is bent at an angle of 90° to the surface of said integrated circuit device.

3. A method of forming an inductor on a bond lead of an integrated circuit device as defined in claim 1 wherein said step of applying an electrical insulator comprises applying a polyimide tape on said lead frame.

4. A method of forming an inductor on a bond lead of an integrated circuit device as defined in claim 1 together with the step of connecting at least one end of said coil to one of said bonding pads.

5. A method of forming an inductor on a bond lead of an integrated circuit device as defined in claim 1 wherein said integrated circuit includes a plurality of bond leads; together with the step of connecting at least one end of said coil to one of said another bond lead.

6. A method of forming an inductor on a bond lead of an integrated circuit device as defined in claim 1 together with the step of applying a magnetic material on said portion of said bond lead prior to applying said electrical insulator on said core.

* * * * *